(12) United States Patent
Ishida

(10) Patent No.: US 9,177,839 B2
(45) Date of Patent: Nov. 3, 2015

(54) COVER PART, PROCESS GAS DIFFUSING AND SUPPLYING UNIT, AND SUBSTRATE PROCESSING APPARATUS

(75) Inventor: Toshifumi Ishida, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 808 days.

(21) Appl. No.: 12/399,396

(22) Filed: Mar. 6, 2009

(65) Prior Publication Data

US 2009/0223449 A1    Sep. 10, 2009

Related U.S. Application Data

(60) Provisional application No. 61/050,668, filed on May 6, 2008.

(30) Foreign Application Priority Data

Mar. 6, 2008   (JP) ................................ 2008-056432

(51) Int. Cl.

| | |
|---|---|
| *C23C 16/00* | (2006.01) |
| *C23F 1/00* | (2006.01) |
| *H01L 21/306* | (2006.01) |
| *H01L 21/67* | (2006.01) |
| *H01J 37/32* | (2006.01) |
| *C23C 16/455* | (2006.01) |

(52) U.S. Cl.
CPC .... *H01L 21/67069* (2013.01); *C23C 16/45565* (2013.01); *H01J 37/3244* (2013.01); *H01J 37/32449* (2013.01)

(58) Field of Classification Search
USPC .......................... 118/715; 156/345.33, 345.34
See application file for complete search history.

(56) References Cited

U.S. PATENT DOCUMENTS

| | | | |
|---|---|---|---|
| 4,825,809 A | * | 5/1989 | Mieno ........................... 118/725 |
| 5,105,761 A | * | 4/1992 | Charlet et al. ........... 156/345.36 |
| 6,444,039 B1 | | 9/2002 | Nguyen |

(Continued)

FOREIGN PATENT DOCUMENTS

| | | |
|---|---|---|
| JP | 4-37126 A | 2/1992 |
| JP | 08-153679 | 6/1996 |

(Continued)

OTHER PUBLICATIONS

Office Action issued Dec. 8, 2010 in Korean Application No. 10-2009-0018600 (With English Translation).

(Continued)

*Primary Examiner* — Rakesh Dhingra
(74) *Attorney, Agent, or Firm* — Oblon, McClelland, Maier & Neustadt, L.L.P.

(57) ABSTRACT

A processing gas diffusing and supplying unit includes a supporting portion having an opening, a plate including gas supply holes, an internal space, between the supporting portion and the plate, communicating with the opening, and a cover part installed within the internal space and connected to the opening. The cover part includes a shielding portion which is disposed within the internal space and has a surface facing the opening, a side wall which holds the shielding portion, and a through hole formed at the side wall and communicating with the opening and the internal space. At least a portion of the gas supply holes is located right below the cover part and a height of the internal space is equal to or greater than 8 mm.

9 Claims, 5 Drawing Sheets

(56) References Cited

U.S. PATENT DOCUMENTS

| | | |
|---|---|---|
| 2004/0118345 A1 | 6/2004 | White et al. |
| 2004/0129217 A1* | 7/2004 | Strang ............................ 118/715 |
| 2005/0014382 A1 | 1/2005 | Lee et al. |
| 2006/0054280 A1* | 3/2006 | Jang ......................... 156/345.34 |
| 2006/0060138 A1* | 3/2006 | Keller et al. .................. 118/715 |
| 2006/0086319 A1* | 4/2006 | Kasai et al. ................... 118/715 |
| 2007/0051471 A1* | 3/2007 | Kawaguchi et al. ..... 156/345.36 |
| 2007/0181181 A1 | 8/2007 | Mizusawa |
| 2007/0235136 A1* | 10/2007 | Enomoto et al. ......... 156/345.34 |
| 2008/0078746 A1 | 4/2008 | Masuda |
| 2009/0159002 A1 | 6/2009 | Bera et al. |

FOREIGN PATENT DOCUMENTS

| | | | |
|---|---|---|---|
| JP | 11-54440 | 2/1999 | |
| WO | WO 2004/111297 | * 12/2004 | ............ C23C 16/455 |

OTHER PUBLICATIONS

Japanese Office Action issued Nov. 13, 2012 in Patent Application No. 2008-056432.

Japanese Office Action dated Apr. 1, 2014, in a counterpart Japanese application No. 2013-056280.

U.S. Office Action mailed Jul. 23, 2015, in co-pending U.S. Appl. No. 13/838,468.

* cited by examiner

COVER PART, PROCESS GAS DIFFUSING AND SUPPLYING UNIT, AND SUBSTRATE PROCESSING APPARATUS

FIELD OF THE INVENTION

The present invention relates to a cover part, a processing gas diffusing and supplying unit and a substrate processing apparatus, and more particularly, to a cover part for a substrate processing apparatus for plasma processing a substrate.

BACKGROUND OF THE INVENTION

A substrate processing apparatus typically includes a processing chamber that accommodates a wafer for a semiconductor device (hereinafter simply referred to as "wafer") as a substrate, and a shower head provided in an upper portion of the processing chamber. In such a substrate processing apparatus, a processing gas is supplied into a processing space within the processing chamber through a plurality of gas holes of the shower head, and the wafer is subjected to plasma processing by means of plasma generated from the processing gas in the processing space.

FIG. 7 is a schematic sectional view showing a structure of a shower head included in a conventional substrate apparatus.

A shower head 70 includes a ceiling electrode plate 71 made of a conductive material, an electrode plate holder 72 for holding the ceiling electrode plate 71, and an internal space 73 provided within the electrode plate holder 72. One end of a gas introducing pipe 74 through which a processing gas is introduced into the internal space 73 is connected to the internal space 73. In addition, a plurality of gas supplying holes 75 and 76 which penetrates through the ceiling electrode plate 71 to allow the internal space 73 to communicate with a processing chamber (not shown) is formed in the ceiling electrode plate 71. In the shower head 70, the processing gas introduced into the internal space 73 through the gas introducing pipe 74 is supplied into a processing space through the gas holes 75 and 76.

However, in such a shower head 70, since the processing gas in the internal space 73 is injected from the gas introducing pipe 74 in the downward direction of the figure, the amount of processing gas passing through the gas hole 75 located immediately below the gas introducing pipe 74 is relatively large while the amount of processing gas passing through the gas holes 76 is relatively small. In this case, since the processing gas cannot be uniformly supplied through the gas holes 75 and 76 into the processing space, plasma generated from the processing gas cannot be uniformly distributed on a wafer. On this account, a surface of the wafer may not be subjected to uniform plasma processing, and as a result, it becomes difficult to secure in-plane uniformity of the plasma processing.

In this connection, there has been proposed a substrate processing apparatus provided with a shower head having buffer plates arranged within its internal space.(see, e.g., Japanese Patent Laid-open Publication No. H-11-054440) In such a shower head, the buffer plate 77 is disposed to face an opening of the gas introducing pipe 74 in the internal space 73 (see FIG. 8). The buffer plate serves to diffuse the processing gas injected from the gas introducing pipe 74 in the internal space 73 in a horizontal direction of the figure while preventing the processing gas from directly flowing through the gas hole 75. This prevents the amount of processing gas passing through the gas hole 75 from extremely increasing and allows the processing gas to be uniformly supplied through the gas holes 75 and 76 into the processing space.

However, there is a case where the thickness (in the vertical direction of the figure) of the shower head 70 is limited and the height of the internal space 73 cannot be sufficiently secured. In this case, the buffer plate 77 is disposed within the internal space 73 and the internal space 73 is divided into an upper space and a lower space. However, the height of both of the upper and lower spaces is extremely lowered, it becomes difficult to increase a conductance with regard to a horizontal flow (diffusion) of the processing gas. As a result, since the processing gas in the internal space 73 cannot be sufficiently diffused in the horizontal direction, the processing gas cannot be uniformly supplied into the processing space, thereby still making it difficult to secure in-plane uniformity of plasma processing for the wafer.

SUMMARY OF THE INVENTION

The present invention provides a cover part which is capable of securing in-plane uniformity of plasma processing and the like for a substrate, a processing gas diffusing and supplying unit, and a substrate processing apparatus.

In accordance with a first aspect of the invention, there is provided a cover part provided in a substrate processing apparatus including a process chamber for accommodating a substrate, a processing gas diffusing and supplying unit which diffuses and supplies a processing gas in the processing chamber, and at least one processing gas introducing pipe for introducing the processing gas into the processing gas diffusing and supplying unit, the processing gas diffusing and supplying unit including an internal space formed therein and widening in parallel to a surface of the substrate accommodated in the processing chamber and gas holes which allow the internal space to communicate with the processing chamber, the processing gas introducing pipe being connected to the internal space via an opening, the opening facing a portion of the gas holes, and the cover part covering the opening, the cover part including: a shielding portion which is disposed within the internal space and has a surface facing the opening; and a holding portion which holds the shielding portion at a predetermined position.

It is preferable that a surface of the shielding portion is extended in parallel to the surface of the substrate accommodated in the processing chamber Preferably, a height of the internal space with regard to a diffusion direction of the processing gas is equal to or greater than 8 mm.

Preferably, the cover part is formed of a cylinder-shaped member having the shielding portion as a bottom portion and the supporting portion as a side wall, the side wall having at least one through hole.

In accordance with a second aspect of the invention, there is provided a processing gas diffusing and supplying unit provided in a substrate processing apparatus including a processing chamber for accommodating a substrate and at least one processing gas introducing pipe, the processing gas diffusing and supplying unit including an internal space formed therein and widening in parallel to a surface of the substrate accommodated in the processing chamber, gas holes which allow the internal space to communicate with the processing chamber, and an opening which faces a portion of the gas holes and is interposed between the processing gas introducing pipe and the internal space to allow the processing gas introducing pipe to communicate with the internal space, the processing gas diffusing and supplying unit diffusing and supplying the processing gas in the processing chamber, the processing gas diffusing and supplying unit including: a cover part covering the opening, wherein the cover part includes a shielding portion which is disposed within the internal space and has a surface facing the opening, and a holding portion which holds the shielding portion at a predetermined position.

It is preferably that a wall portion which defines the internal space, the shielding portion and the supporting portion are formed in a single body.

In accordance with a third aspect of the invention, there is provided a substrate processing apparatus including a process chamber for accommodating a substrate, a processing gas diffusing and supplying unit which diffuses and supplies a processing gas in the processing chamber, and at least one processing gas introducing pipe for introducing the processing gas into the processing gas diffusing and supplying unit, the processing gas diffusing and supplying unit including an internal space formed therein and widening in parallel to a surface of the substrate accommodated in the processing chamber and gas holes which allow the internal space to communicate the processing chamber, the processing gas introducing pipe being connected to the internal space via an opening, and the opening facing a portion of the gas holes, wherein the processing gas diffusing and supplying unit includes a cover part covering the opening, and wherein the cover part includes a shielding portion which is disposed within the internal space and has a surface facing the opening, and a holding portion which holds the shielding portion at a predetermined position.

According to the cover part of the first aspect, the processing gas diffusing and supplying unit of the second aspect and the substrate processing apparatus of the third aspect, since the shielding portion faces the opening of the processing gas introducing pipe in the internal space which widens in parallel to the surface of the substrate, the processing gas introduced through the opening of the processing gas introducing pipe collides with the shielding portion to diffuse in substantially parallel to the surface of the substrate in the internal space. That is, since the processing gas diffuses in substantially parallel to the surface of the substrate, there is no need to divide the internal space into an upper space and a lower space. As a result, it is possible to secure the height of the internal space with regard to a diffusion direction of the processing gas to thereby increase a conductance of the processing gas and allow the processing gas to be supplied uniformly into the processing chamber. Accordingly, it is possible to secure in-plane uniformity of plasma process or the like in the substrate.

Further, since the surface of the shielding portion is extended in parallel to the surface of the substrate accommodated in the processing chamber, the shielding portion can reliably diffuse the processing gas introduced through the opening of the processing gas introducing pipe in parallel to the surface of the substrate in the internal space, thereby reliably and uniformly supplying the processing gas into the processing chamber.

In addition, since the height of the internal space with regard to the diffusion direction of the processing gas is equal to or greater than 8 mm, it is possible to increase the conductance of the processing gas reliably.

Furthermore, since the side wall of the cylinder-shaped member covering the opening has at least one through holes, it is possible to inject the processing gas substantially perpendicularly to the side of the cylinder-shaped member from the processing gas introducing pipe toward the internal space. As a result, it is possible to diffuse the processing gas more reliably in parallel to the surface of the substrate in the internal space.

Moreover, since the wall portion which defines the internal space, since the shielding portion and the supporting portion are formed in a single body, it is possible to secure in-plane uniformity of plasma process in the substrate without increasing the number of parts of the processing gas diffusing and supplying unit.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, exemplary embodiments of the present invention will be described with reference to the accompanying drawings which form a part hereof.

Figure 1:
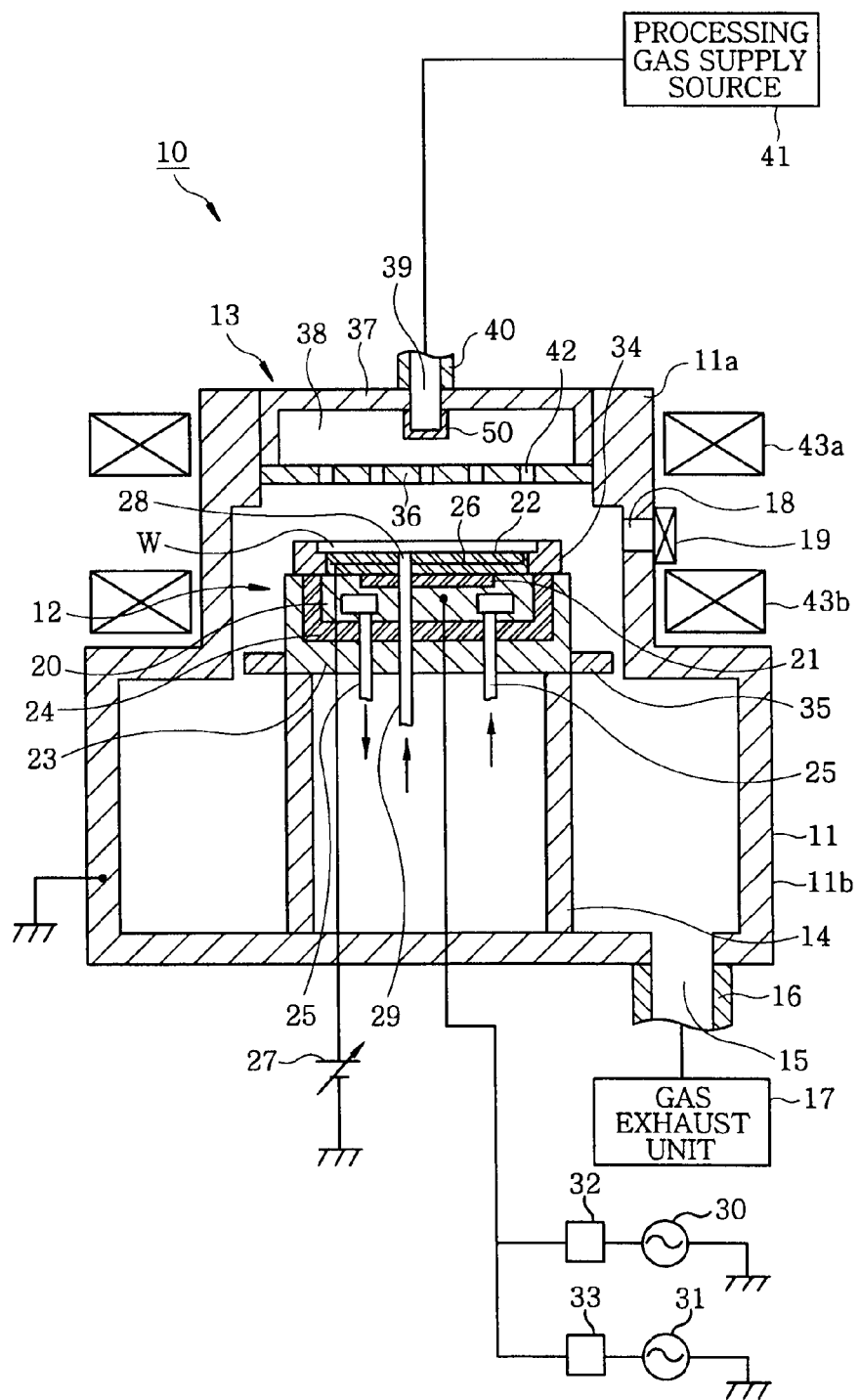
FIG. 1 is a schematic sectional view showing a configuration of a plasma processing apparatus provided with a cover part according to an embodiment of the present invention.

FIG. 1 is a schematic sectional view showing a configuration of a plasma processing apparatus provided with a cover part in accordance with an embodiment of the present invention. The shown plasma processing apparatus is configured to subject a semiconductor wafer (substrate) having a diameter of, e.g., 300 mm to plasma etching, for example, reactive ion etching (RIE), or ashing.

In FIG. 1, the plasma processing apparatus 10 (substrate processing apparatus) includes, for example, a processing chamber 11 such as a vacuum chamber, a mounting table 12 arranged in a central portion of the bottom of the processing chamber 11, and a shower head 13 (processing gas diffusing and supplying unit) arranged to face the mounting table 12 above the mounting table 12.

The processing chamber 11 includes a smaller diameter cylindrical upper chamber 11a and a larger diameter cylindrical lower chamber 11b. The upper chamber 11a and the lower chamber 11b communicate with each other and the processing chamber 11 is made airtight as a whole. The mounting table 12 or the shower head 13 is accommodated in the upper chamber 11a and a support case 14 which supports the mounting table 12 and accommodating a pipe for coolant or back side gas is received in the lower chamber 11b.

A gas exhaust port 15 is provided in the bottom side of the lower chamber 11b and a gas exhaust unit 17 is connected to the gas exhaust port 15 via a gas exhaust pipe 16. The gas exhaust unit 17 includes an adaptive pressure control (APC) valve and a dry pump (DP) or a turbo molecular pump (TMP) (all not shown), which are controlled by a signal from a controller (not shown) to keep the inside of the processing chamber 11 at a desired degree of vacuum by performing vacuum exhaust. Meanwhile, a loading/unloading port 18 for a wafer W is provided in a side of the upper chamber 11a and can be opened/closed by means of a gate valve 19. The upper chamber 11a and the lower chamber 11b are made of conductive material such as aluminum or the like and are grounded.

The mounting table 12 includes a lower electrode 20 for plasma generation, which is a table-like upper member made of, for example, conductive material such as aluminum, a dielectric layer 21 made of dielectric material such as ceramic, which is buried in an upper central portion of the lower electrode 20 to make intensity of an electric field uniform in a processing space which will be described later, and an electrostatic chuck 22 for electrostatically attracting and holding the wafer W on a mounting surface. In the mounting table 12, the lower electrode 20, the dielectric layer 21 and the electrostatic chuck 22 are laminated in that order. In addition, the lower electrode 20 is fixed to a support 23 installed on the support case 14 through an insulating member 24 and remains electrically floated sufficiently with respect to the processing chamber 11.

A coolant path 25 through which the coolant flows is formed in the lower electrode 20. With the coolant flowing through the coolant path 25, the lower electrode 20 is cooled and the wafer W mounted on the mounting surface on the electrostatic chuck 22 is accordingly cooled to a desired temperature.

The electrostatic chuck 22 is made of dielectric material and contains a conductive electrode film 26. The electrode film 26 is made of, e.g., electrode material which is a mixture of alumina ($Al_2O_3$) and molybdenum carbide (MoC) A high voltage DC power supply 27 is connected to the electrode film 26 and high voltage DC power supplied to the electrode film 26 produces a Coulomb force between the mounting surface of the electrostatic chuck 22 and the wafer W, thereby electrostatically attracting and holding the wafer W on the mounting surface.

In addition, a through hole 28 through which a backside gas for increasing thermal conductivity between the mounting surface and the backside of the wafer W is ejected is formed in the electrostatic chuck 22. The through hole 28 communicates with a gas path 29 formed in the lower electrode 20 and the like and the back side gas such as helium (He) supplied from a gas supplying unit (not shown) is ejected through the gas path 29 and the through hole 28.

The lower electrode 20 is connected with a first radio frequency (RF) power supply 30 for supplying RF power having a frequency of 100 MHz and a second RF power supply 31 for supplying RF power of, example, a frequency of 3.2 MHz, which is lower than the frequency of the first RF power supply 30, via their respective matching unit 32 and 33. The RF power supplied from the first RF power supply 30 generates plasma from the processing gas and the RF power supplied from the second RF power supply 31 applies a bias voltage to the wafer W, thereby attracting ions in the plasma to the surface of the wafer W.

In addition, a focus ring 34 surrounding the electrostatic chuck 22 is arranged on the outer peripheral portion of the top side of the lower electrode 20. The focus ring 34 widens a contacting area of the plasma beyond a space facing the wafer W in the process space which will be described later, thereby improving uniformity of an etching rate in the plane of the wafer W.

A baffle plate 35 surrounding the support 23 is arranged in the lower outer side of the support 23. The baffle plate 35 serves as a rectifying plate for regulating a flow of the processing gas by allowing the processing gas in the upper chamber 11a to flow into the lower chamber 11b through a gap formed between the baffle plate 35 and a wall portion of the upper chamber 11a and prevents the plasma in the process space, which will be described later, from being leaked into the lower chamber 11b.

The shower head 13 serving as an upper electrode includes a ceiling electrode plate 36 which faces the upper chamber 11a and is made of conductive material, an electrode plate holder 37 (wall portion) for holding the ceiling electrode plate, an internal space 38 provided within the electrode plate support 37, and a cover part 50 which will be described later. The internal space 38 extends in parallel to the surface of the wafer W which is accommodated in the processing chamber 11 and mounted on the mounting table 12. One end of a processing gas introducing pipe 40 is connected to the internal space 38 via an opening 39 and the other end thereof is connected to a processing gas supply source 41. The processing gas supply source 41 has a processing gas supply amount control mechanism (not shown) and controls the supply amount of processing gas. In addition, the ceiling electrode plate 36 has a plurality of gas supply holes 42 (gas holes) formed therethrough which allow the internal space 38 to communicate with the upper chamber 11a. The shower head 13 distributes the processing gas, which is introduced from the processing gas introducing pipe 40 into the internal space 38 of the electrode support 37, into the upper chamber 11a through the gas supply holes 42.

In the plasma processing apparatus 10, two multi-pole ring magnets 43a and 43b are disposed above and below the gate valve 19 around the upper chamber 11a, respectively. In each of the multi-pole ring magnets 43a and 43b, a plurality of anisotropic segment columnar magnets (not shown) is accommodated in a ring-like magnetic casing (not shown). In the casing, the plurality of anisotropic segment pillar-like magnets is arranged in such a manner that directions of magnetic poles of adjacent segment columnar magnets are opposite to each other. With such arrangement, magnetic force lines are formed between adjacent segment columnar magnets, a magnetic field is formed around the processing space located between the shower head 13, which serves as the upper electrode, and the lower electrode 20, thereby confining the plasma in the processing space. Alternatively, the plasma processing apparatus may be configured without the multi-pole ring magnets 43a and 43b.

In the plasma processing apparatus 10, when the wafer W is subjected to RIE or ashing, after the pressure of the processing chamber 11 is adjusted to a desired degree of vacuum, by introducing the processing gas into the upper chamber 11a and supplying RF powers from the first RF power supply 30 and the second RF power supply 31 to the upper chamber 11a, plasma is generated from the processing gas, and at the same time, ions in the plasma are attracted to the wafer W.

Figure 2:
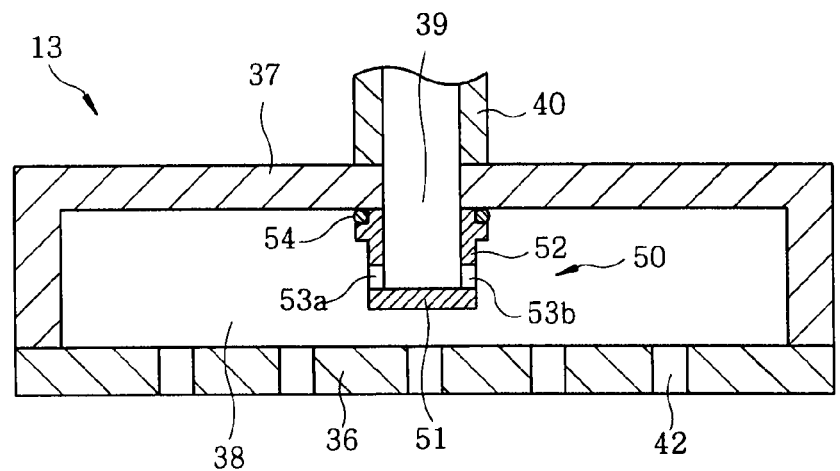
FIG. 2 is a schematic sectional view showing a configuration of a processing gas diffusing and supplying unit shown in FIG. 1.

FIG. 2 is a schematic sectional view showing a configuration of the processing gas diffusing and supplying unit shown in FIG. 1.

Figure 3:
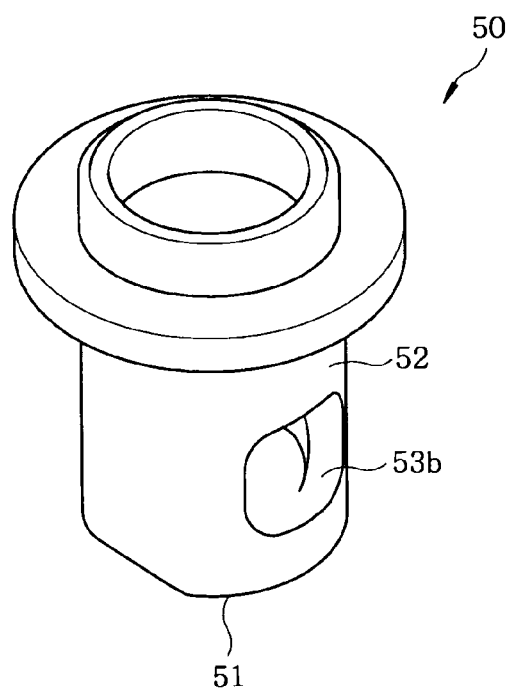
FIG. 3 is a schematic perspective view showing a configuration of the cover part shown in FIG. 1.

In FIG. 2, the cover part 50 includes a bottom portion 51 (shielding portion) which is disposed in the internal space 38 to face and cover the opening 39, and a side wall 52 (supporting portion) for supporting the bottom portion 51 in a predetermined position in the internal space 38, for example, in the center of the internal space 38 in the vertical direction of the figure. The cover part 50 has a hollow cylindrical shape whose one end is opened, as a whole (see FIG. 3). Here, the bottom portion 51 has a disc shape and the side wall 52 is extended perpendicular to the bottom portion 51. In addition, the side wall 52 holds the bottom portion 51 in such a manner that a surface of the bottom portion 51 is made parallel to the surface of the wafer W which is accommodated in the processing chamber 11 and mounted on the mounting table 12. An O-ring 54 is interposed between the opened end of the cover part 50 and the electrode plate support 37 to make a hermetical seal between the cover part 50 and the electrode plate support 37. In addition, through holes 53a and 53b are formed in the side wall 52 and the processing gas which introduced into the cover part 50 through the opening 39 is introduced into the internal space 38 via the through holes 53a and 53b.

In the plasma processing apparatus 10, the processing gas introduced into the cover part 50 collides with the bottom portion 51 of the cover part 50. Since the bottom portion 51 faces the opening 39 and a flow of the introduced processing gas is greatly curved by the collision, the introduced processing gas is not directly injected toward a gas supply hole 42 located right below the opening 39. In addition, after colliding with the bottom portion 51, the processing gas flows along the surface of the bottom portion 51 and diffuses into the internal space 38 via the through holes 53a and 53b. Here, as described above, since the surface of the bottom portion 51 is parallel to the surface of the wafer W mounted on the mounting table 12, the processing gas diffused from the through holes 53a and 53b is injected substantially perpendicular to the side wall 52 and is diffused in the internal space in substantially parallel to the surface of the wafer W.

Figure 8:
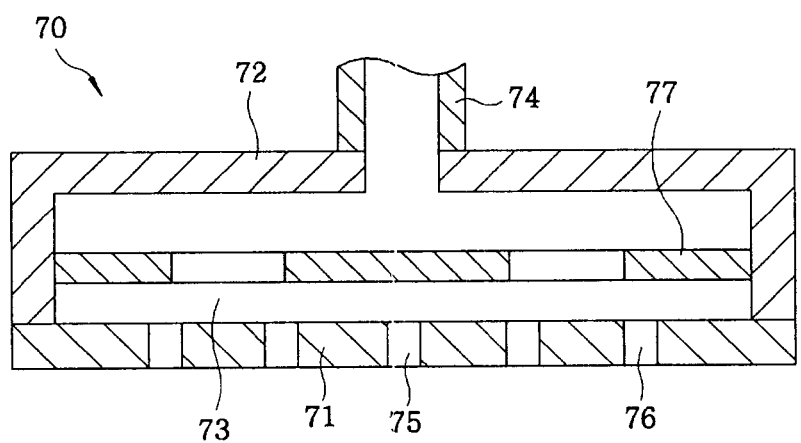
FIG. 8 is a schematic sectional view showing a configuration of a conventional shower head provided with buffer plates.

With the plasma processing apparatus 10 according to this embodiment, there is no need to divide the internal space 38 into an upper space and a lower space (see FIG. 8). As a result, it is possible to secure sufficient height with regard to the diffusion direction of the processing gas and thus increase a conductance with regard to the diffusion direction of the processing gas in the internal space 38. The effect that the greater height of the internal space 38 gives the larger conductance will be described below with reference to FIG. 4.

Figure 4:
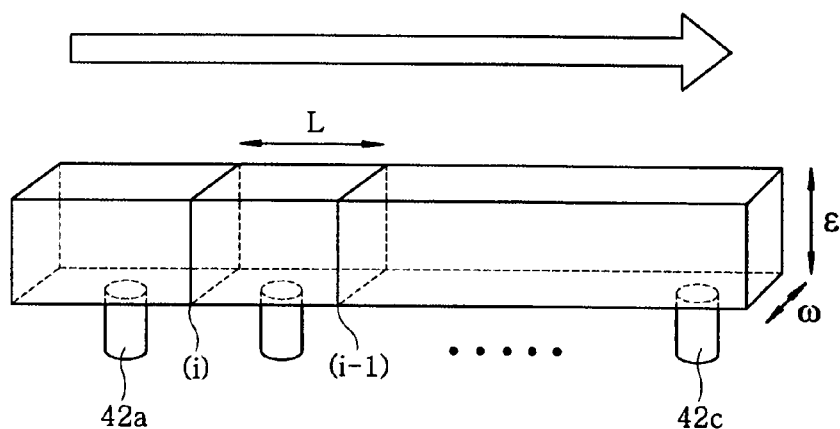
FIG. 4 is a view for explaining a conductance with regard to a gas flow.

FIG. 4 is a view for explaining a conductance with regard to a gas flow direction.

In FIG. 4, a rectangular parallelopipedon represents a space where a gas flows and a white arrow in the figure represents a gas flow direction. In the figure, it is assumed that the height of the space is $\epsilon$, the width thereof is $\omega$, and the length of a space defined by a plane (i) and a plane (i−1) is L. Assuming that pressures exerted on the plane (i) and the plane (i−1) are $P_{si}$ and $P_{s(i-1)}$, respectively, and a viscosity coefficient is $\mu$, a conductance with regard to the gas flow direction in the space defined by the plane (i) and the plane (i−1) is expressed by the following Equation 1.

$$C_{si} = \epsilon^3 \omega / 12 \mu L \cdot (P_{si} + P_{s(i-1)})/2 \qquad \text{Eq. 1}$$

According to Eq. 1, since the conductance $C_{si}$ is in proportion to the cube of the height of the space, it can be seen that the greater height of the space give the larger conductance with regard to the gas flow direction.

In addition, a flow rate $Q_{si}$ of the gas flowing through the space defined by the plane (i) and the plane (i−1) is expressed by the following Equation 2.

$$Q_{si} = C_{si}(P_{si} - P_{s(i-1)}) \qquad \text{Eq. 2}$$

According to Eqs. 1 and 2, since the flow rate of the gas flowing through the space is in proportion to the conductance and the conductance is in proportion to the cube of the height of the space, it can be seen that the flow rate of the gas depends greatly on the height of the space and the greater height gives the larger flow rate.

Here, it is assumed that the space represented by the rectangular parallelopipedon is substituted with the internal space 38 of the plasma processing apparatus 10, with the gas supply holes 42 located in the bottom of the rectangular parallelopipedon (see FIG. 4), with a gas supply hole 42a, which is a portion of the gas supply holes 42, located right below the opening 39 and the cover part 50, and with a gas supply hole 42c located in the outer peripheral portion of the internal space 38. As described above, since the flow rate with regard to the gas diffusion direction increases when the height of the space is sufficiently secured, the processing gas can sufficiently diffuse up to the internal space 38 apart in the right direction of FIG. 4 (that is, the space right above the gas supply hole 42c) from the internal space 38 right below the opening 39 (that is, the space right above the gas supply hole 42a). Accordingly, the processing gas can be uniformly supplied into the processing chamber 11 through the gas supply holes 42a and 42c, thereby securing in-plane uniformity of the plasma process in the wafer W. In addition, the present inventor confirmed that the processing gas can diffuse more effectively when the height of the internal space 38 is equal to or greater than 8 mm.

Figure 5:
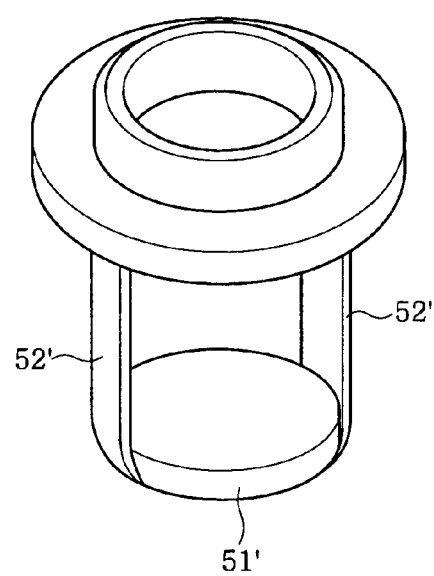
FIG. 5 is a schematic perspective view showing a first modification of the cover part.
Figure 6:
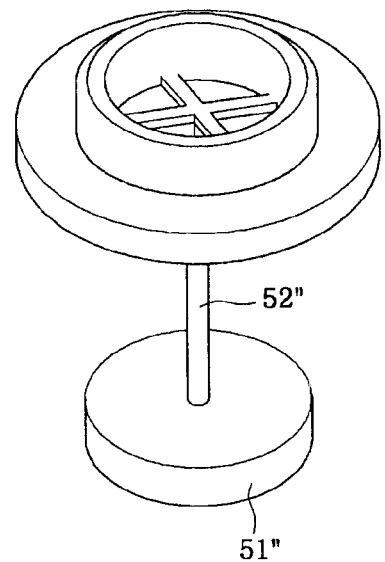
FIG. 6 is a schematic perspective view showing a second modification of the cover part.
Figure 7:
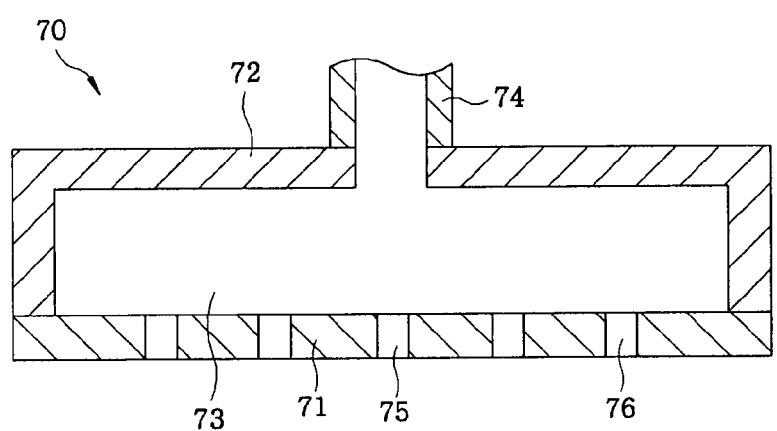
FIG. 7 is a schematic sectional view showing a configuration of a conventional shower head.

Although it has been illustrated in the above-described embodiment that the cover part 50 has the cylindrical shape, the cover part 50 is not limited thereto. For example, the side wall 52 of the cover part 50 may have a plate shape as shown in FIG. 5 or a bar shape as shown in FIG. 6. In addition, the bottom portion 51 may have a surface covering the opening 39 and is not limited to the disc shape.

In addition, the cover part 50 and the shower head 13 may be formed in a single body, which provides no need to increase the number of parts of the shower head, thereby avoiding complexity of processes of manufacturing the shower head 13 and the plasma processing apparatus 10.

EXAMPLES

Next, examples of the present invention will be described.

Inventive Examples 1 and 2

First, the present inventor prepared a wafer Wox having an oxide film formed on its entire surface, loaded the wafer Wox in the processing chamber 11 of the plasma processing apparatus 10 provided with the cover part 50 as shown in FIG. 2, and then subjected the wafer Wox to RIE. After completion of RIE, the thickness of the oxide film throughout the surface of the wafer Wox was measured and then an etching rate and nonuniformity of the etching rate were calculated (Inventive Example 1). In addition, a wafer Wpr having a photoresist film formed on its entire surface was prepared, the wafer Wpr was subjected to the same process as Inventive Example 1, and then an etching rate and nonuniformity of the etching rate were calculated (Inventive Example 2).

Comparative Examples 1 and 2

Next, the present inventor loaded a wafer Wox having an oxide film formed on its entire surface in the processing chamber 11 of the plasma processing apparatus 10 provided with the shower head 70 having the buffer plate 77 (see FIG. 8) instead of the shower head 13, and then subjected the wafer Wox to RIE as in Inventive Example 1. After completion of RIE, the thickness of the oxide film throughout the surface of the wafer Wox was measured and then an etching rate and nonuniformity of the etching rate were calculated (Comparative Example 1). In addition, a wafer Wpr having a photoresist film formed on its entire surface was subjected to the same process as Comparative Example 1, and then an etching rate and nonuniformity of the etching rate were calculated (Comparative Example 2).

Table 1 shows results of the calculation for Inventive Examples 1 and 2 and Comparative Examples 1 and 2.

TABLE 1

|  | Wafer used | Etching rate (nm/min) | Nonuniformity of etching rate (%) |
|---|---|---|---|
| Inventive EX 1 | Wox | 442.4 | 3.0 |
| Inventive EX 2 | Wpr | 89.2 | 65.2 |
| Comparative EX 1 | Wox | 457.8 | 7.6 |
| Comparative EX 2 | Wpr | 106.4 | 75.8 |

It was confirmed from Inventive Examples 1 and 2 and Comparative Example 1 and 2 that the nonuniformity of the etching rate was low (that is, uniformity is high) when any of the wafers Wox and Wpr was subjected to the plasma process using the plasma processing apparatus 10 provided with the cover part 50 instead of the buffer plate. It can be seen from this result that the plasma processing apparatus 10 provided with the cover part 50 can lower nonuniformity of an etching rate of the surface of the wafer W and thus secure in-plane uniformity of the wafer W.

While the invention has been shown and described with respect to the embodiments, it will be understood by those skilled in the art that various changes and modification may be made without departing from the scope of the invention as defined in the following claims.

What is claimed is:

1. A substrate processing apparatus for plasma etching a substrate comprising:
   a processing chamber that accommodates the substrate;
   a processing gas diffusing and supplying unit serving as a showerhead that supplies a processing gas to the processing chamber;
   a susceptor serving as a lower electrode configured to mount the substrate;
   at least one processing gas introducing pipe that introduces the processing gas into the processing gas diffusing and supplying unit; and
   a gas exhaust pipe connected to a gas exhaust unit that performs vacuum exhaust of the processing chamber,
   wherein the processing gas diffusing and supplying unit includes,
   a supporting portion having an opening,
   a plate including gas supply holes,
   an internal space formed by the supporting portion and the plate, the internal space communicating with the opening, and directly communicating with the gas supply holes,
   a cover part installed within the internal space and attached to the supporting portion, wherein the cover part includes,
   a shielding portion which is disposed within the internal space and has a surface facing the opening,
   a side wall formed from a cylinder shaped member and which holds the shielding portion, the diameter of the cylinder shaped member and the shielding portion being the same, and
   a through hole formed at the side wall and communicating with the opening and the internal space,
   wherein at least a portion of the gas supply holes is located right below the cover part and a height of the internal space is equal to or greater than 8 mm so that the processing gas discharged from the through hole is diffused to the internal space and is uniformly supplied through the gas supply holes, and
   wherein the internal space is in the shape of a rectangular parallelopipedon, the height of the rectangular parallelopipedon is $\epsilon$, a width of the rectangular parallelopipedon is $\omega$, a length of a space defined by a plane (i) and a plane (i−1) in the rectangular parallelopipedon is L, where the plane (i) and the plane (i−1) are perpendicular to a length direction of the rectangular parallelopipedon, pressures exerted on the plane (i) and the plane (i−1) are $P_{si}$ and $P_{s(i-1)}$, respectively, a viscosity coefficient is $\mu$, a conductance Csi with regard to a gas flow direction in the space defined by the plane (i) and the plane (i−1) is expressed by the following:

$$C_{si} = \epsilon^3 \omega / 12 \, \mu L \cdot (P_{si} + P_{s(i-1)})/2, \text{ and}$$

a flow rate $Q_{si}$ of the gas flowing through the space defined by the plane (i) and the plane (i−1) is expressed by the following:

$$Q_{si} = C_{si}(P_{si} - P_{s(i-1)}).$$

2. The substrate processing apparatus of claim 1, wherein the surface of the shielding portion is extended in parallel to a top surface of the substrate accommodated in the processing chamber.

3. The substrate processing apparatus of claim 1, wherein the cover part is formed of a cylinder-shaped member and the side wall has at least one through hole.

4. The substrate processing apparatus of claim 1, wherein an O-ring is interposed between the cover part and the supporting portion to make a hermetical seal therebetween.

5. A showerhead, provided in a plasma processing apparatus for plasma etching a substrate, for supplying a processing gas to a processing chamber comprising:
   a main body;
   an opening configured to introduce the processing gas into the internal space;
   a plate supported by the main body, an internal space formed between a supporting portion of the main body and the plate, the plate including gas supply holes through which the processing gas is supplied into the processing chamber,
   wherein the internal space communicates with the opening and directly communicates with the gas supply holes, and a height of the internal space is equal to or greater than 8 mm so that the processing gas discharged from the opening is diffused to the internal space and is uniformly supplied through the gas supply holes, and
   wherein the internal space is in the shape of a rectangular parallelopipedon, the height of the rectangular parallelopipedon is $\epsilon$, a width of the rectangular parallelopipedon is $\omega$, a length of a space defined by a plane (i) and a plane (i−1) in the rectangular parallelopipedon is L, where the plane (i) and the plane (i−1) are perpendicular to a length direction of the rectangular parallelopipedon, pressures exerted on the plane (i) and the plane (i−1) are $P_{si}$ and $P_{s(i-1)}$, respectively, a viscosity coefficient is $\mu$, a conductance $C_{si}$ with regard to a gas flow direction in the space defined by the plane (i) and the plane (i−1) is expressed by the following:

$$C_{si} = \epsilon^3 \omega / 12 \, \mu L \cdot (P_{si} + P_{s(i-1)})/2, \text{ and}$$

a flow rate $Q_{si}$ of the gas flowing through the space defined by the plane (i) and the plane (i−1) is expressed by the following:

$$Q_{si} = C_{si}(P_{si} - P_{s(i-1)}).$$

6. The showerhead of claim 5, wherein the showerhead further comprises a shielding portion which is disposed within the internal space and has a surface facing the opening, and wherein at least a portion of the gas supply holes is located right below the shielding portion.

7. The showerhead of claim 6, wherein the surface of the shielding portion is extended in parallel to a top surface of the substrate accommodated in the processing chamber.

8. A plasma processing apparatus for plasma etching a substrate comprising:

a processing chamber configured to accommodate the substrate;

a showerhead configured to supply a processing gas to the processing chamber;

a susceptor serving as a lower electrode configured to mount the substrate;

at least one processing gas introducing pipe configured to introduce the processing gas into the showerhead; and a gas exhaust pipe connected to a gas exhaust unit to perform vacuum exhaust of the processing chamber, wherein the showerhead includes:

a main body;

an opening configured to introduce the processing gas into the internal space;

a plate supported by the main body, an internal space formed between a supporting portion of the main body and the plate, the plate including gas supply holes through which the processing gas is supplied into the processing chamber; and a shielding portion which is disposed within the internal space and has a surface facing the opening, wherein the internal space communicates with the opening and directly communicates with the gas supply holes, and at least a portion of the gas supply holes is located right below the shielding portion and a height of the internal space is equal to or greater than 8 mm so that the processing gas discharged from the opening is diffused to the internal space and is uniformly supplied through the gas supply holes, and wherein the internal space is in the shape of a rectangular parallelopipedon, the height of the rectangular parallelepipedon is $\epsilon$, a width of the rectangular parallelopipedon is $\omega$, a length of a space defined by a plane (i) and a plane (i−1) in the rectangular parallelopipedon is L, where the plane (i) and the plane (i−1) are perpendicular to a length direction of the rectangular parallelopipedon, pressures exerted on the plane (i) and the plane (i−1) are $P_{si}$ and $P_{s(i-1)}$, respectively, a viscosity coefficient is $\mu$, a conductance $C_{si}$ with regard to a gas flow direction in the space defined by the plane (i) and the plane (i−1) is expressed by the following:

$$C_{si}=\epsilon^3\omega/12\,\mu L\cdot(P_{si}+P_{s(i-1)})/2, \text{ and}$$

a flow rate $Q_{si}$ of the gas flowing through the space defined by the plane (i) and the plane (i−1) is expressed by the following:

$$Q_{si}=C_{si}(P_{si}-P_{s(i-1)}).$$

9. The plasma processing apparatus of claim 8, wherein the surface of the shielding portion is extended in parallel to a top surface of a substrate accommodated in the processing chamber.

* * * * *